United States Patent
Kanemura

(10) Patent No.: US 11,784,231 B2
(45) Date of Patent: Oct. 10, 2023

(54) SEMICONDUCTOR DEVICE WITH DUMMY GATES IN PERIPHERAL REGION

(71) Applicant: KIOXIA CORPORATION, Tokyo (JP)

(72) Inventor: Takahisa Kanemura, Yokohama Kanagawa (JP)

(73) Assignee: Kioxia Corporation, Tokyo (JP)

(*) Notice: Subject to any disclaimer, the term of this patent is extended or adjusted under 35 U.S.C. 154(b) by 335 days.

(21) Appl. No.: 17/006,297

(22) Filed: Aug. 28, 2020

(65) Prior Publication Data
US 2021/0296457 A1 Sep. 23, 2021

(30) Foreign Application Priority Data

Mar. 23, 2020 (JP) ................................ 2020-051338

(51) Int. Cl.
*H01L 29/66* (2006.01)
*H10B 43/40* (2023.01)
(Continued)

(52) U.S. Cl.
CPC .......... *H01L 29/4234* (2013.01); *H01L 29/24* (2013.01); *H01L 29/66545* (2013.01); *H01L 29/792* (2013.01); *H10B 43/10* (2023.02); *H10B 43/27* (2023.02); *H10B 43/35* (2023.02); *H10B 43/40* (2023.02)

(58) Field of Classification Search
CPC ...... H01L 27/115–11597; H10B 69/00; H10B 53/00; H10B 53/10; H10B 53/20; H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00;
(Continued)

(56) References Cited

U.S. PATENT DOCUMENTS 6,642,581 B2  11/2003  Matsuda et al.
2004/0140502 A1*  7/2004  Murata ............... H01L 27/1104
257/E27.099

(Continued)

FOREIGN PATENT DOCUMENTS

JP    2010028004 A   2/2010
WO   2009032678 A1   3/2009

*Primary Examiner* — Didarul A Mazumder
*Assistant Examiner* — Gustavo G Ramallo
(74) *Attorney, Agent, or Firm* — Kim & Stewart LLP

(57) ABSTRACT

According to one embodiment, a semiconductor device includes a memory region and a peripheral circuit region, the peripheral circuit region includes a first region and a second region outside of the first region. The semiconductor device includes, in the first region, a transistor including a gate insulating layer and a gate structure that includes a gate electrode. A first structure is in the second region and includes a first insulating layer and a dummy gate electrode on the first insulating layer. The first insulating layer has a side surface facing outward from the peripheral circuit region and a second insulating layer that covers the first side surface and is an insulating material other than a silicon oxide.

19 Claims, 14 Drawing Sheets

(51) Int. Cl.
  *H01L 29/423* (2006.01)
  *H01L 29/792* (2006.01)
  *H01L 29/24* (2006.01)
  *H10B 43/10* (2023.01)
  *H10B 43/27* (2023.01)
  *H10B 43/35* (2023.01)

(58) Field of Classification Search
  CPC ........ H10B 51/10; H10B 51/20; H10B 51/30; H10B 51/40; H10B 51/50
  See application file for complete search history.

(56) References Cited

U.S. PATENT DOCUMENTS

| | | | |
|---|---|---|---|
| 2005/0035397 A1* | 2/2005 | Otoi | H01L 27/105 257/E27.081 |
| 2016/0049421 A1* | 2/2016 | Zhang | H01L 29/7845 257/314 |
| 2018/0204847 A1* | 7/2018 | Katou | H01L 29/66833 |
| 2020/0227426 A1* | 7/2020 | Chuang | H01L 21/0332 |

* cited by examiner

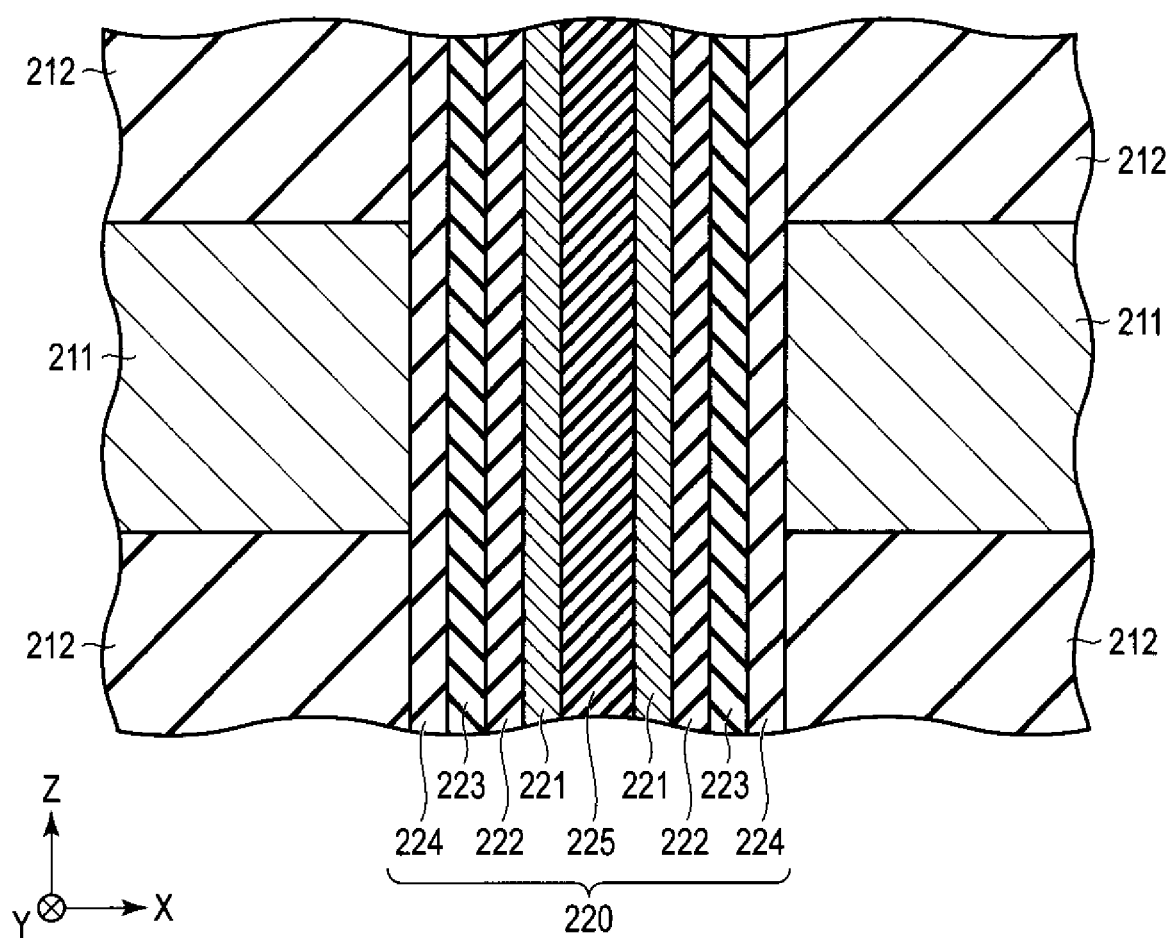

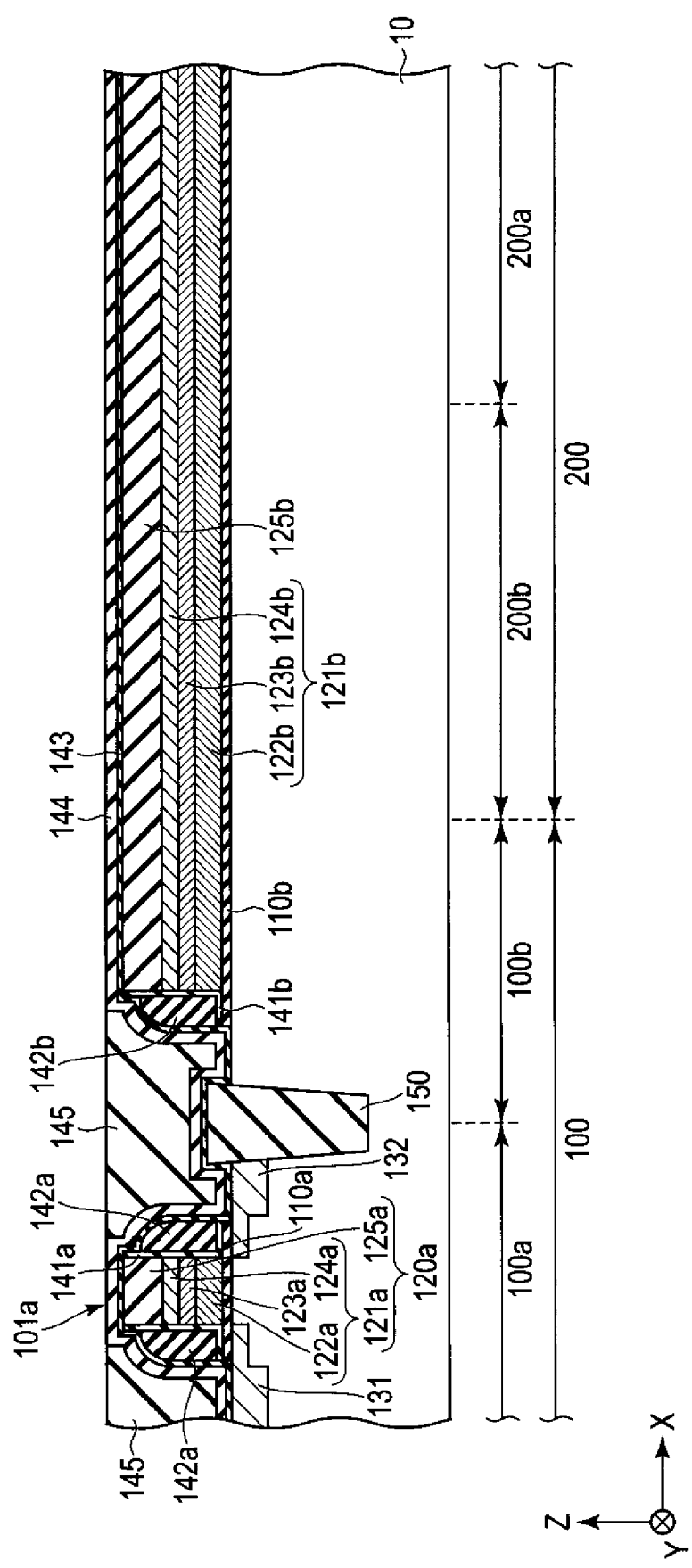

US 11,784,231 B2

SEMICONDUCTOR DEVICE WITH DUMMY GATES IN PERIPHERAL REGION

This application is based upon and claims the benefit of priority from Japanese Patent Application No. 2020-051338, filed Mar. 23, 2020, the entire contents of which are incorporated herein by reference.

FIELD

Embodiments described herein relate generally to a semiconductor device.

BACKGROUND

It is important to minimize adverse influences on a peripheral circuit region during the forming of a three-dimensional nonvolatile memory having a plurality of memory cells stacked in a perpendicular direction from a substrate.

BRIEF DESCRIPTION OF THE DRAWINGS

FIG. 4A is a cross-sectional view schematically showing details of a memory cell section in a semiconductor device according to an embodiment.

FIGS. 5-12 are cross-sectional views schematically depicting aspects of a manufacturing process of a semiconductor device according to an embodiment.

DETAILED DESCRIPTION

An embodiment provides a semiconductor device capable of mitigating certain influences on a peripheral circuit region of the device that typically occur in the forming of a structure in a memory region of the device.

In general, according to one embodiment, a semiconductor device comprises a memory region and a peripheral circuit region that are adjacent to each other on a semiconductor substrate. The peripheral circuit region has a first region and a second region that is on an outer perimeter of the first region. A transistor is in the first region. The transistor includes a gate insulating layer on the semiconductor substrate and a gate structure on the gate insulating layer. The gate structure includes a gate electrode. A first structure is in the second region. The first structure has a first insulating layer on the semiconductor substrate and a dummy gate electrode on the first insulating layer. The first insulating layer has a first side surface facing outward from the peripheral circuit region. A second insulating layer covers the first side surface of the first insulating layer and is an insulating material other than silicon oxide.

Example embodiments will be described hereinafter with reference to the drawings.

Figure 1:
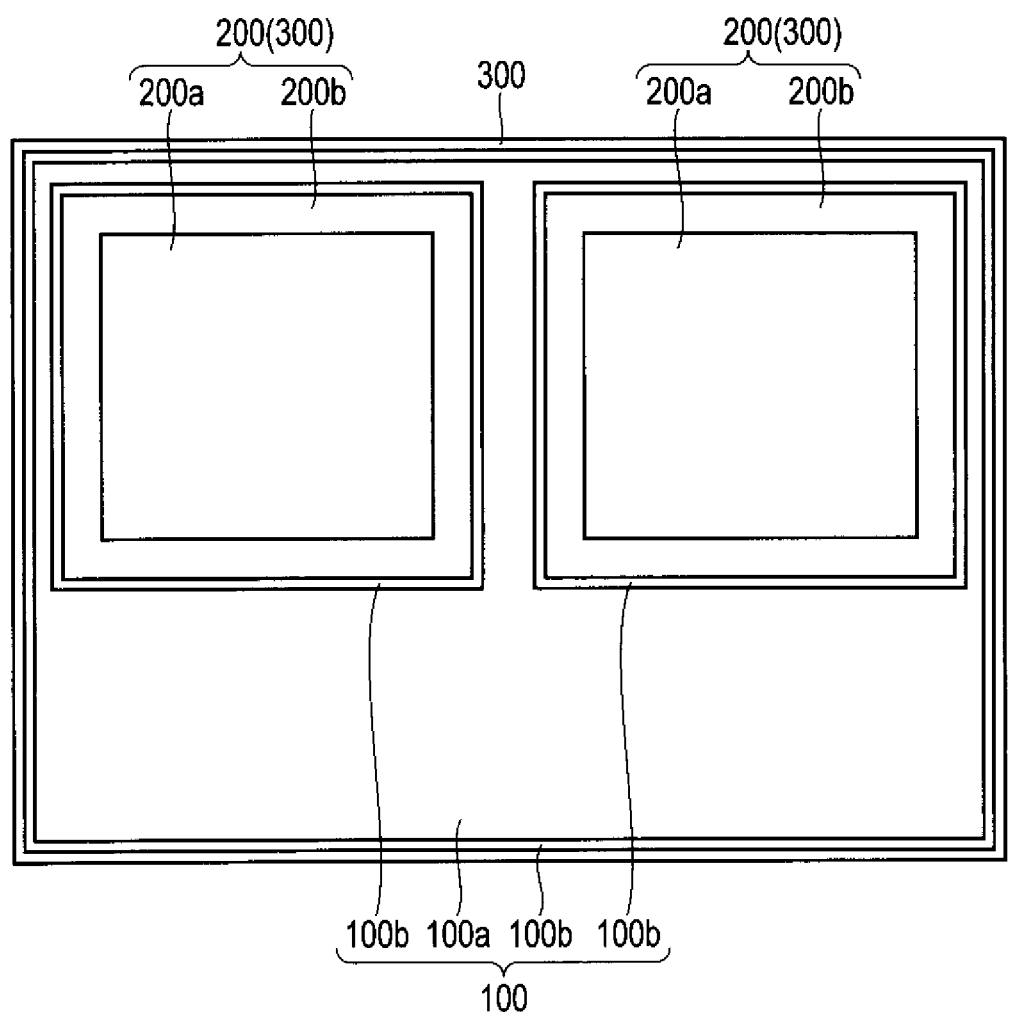
FIG. 1 schematically shows an overall configuration of a semiconductor device according to an embodiment.

FIG. 1 schematically shows an overall configuration of a semiconductor device (also referred to as a nonvolatile semiconductor storage device) according to an embodiment.

As shown in FIG. 1, the semiconductor device includes a peripheral circuit region 100 and a memory region 200 provided adjacently.

The peripheral circuit region 100 includes therein a peripheral circuit for memory cells provided in the memory region(s) 200. The peripheral circuit region 100 includes a circuit region 100a and a dummy region 100b surrounding the circuit region 100a. That is, the dummy region 100b is provided on an outer periphery (perimeter) of the peripheral circuit region 100. The circuit region 100a is where a circuit is actually formed by transistors, interconnections, and the like, while the dummy region 100b is a non-circuit region where no circuit is actually formed.

The memory region 200 includes a cell array region 200a and a stepped region 200b that surrounds the cell array region 200a. A plurality of NAND nonvolatile memory elements each having a three-dimensional structure are provided in the cell array region 200a. The NAND nonvolatile memory elements are each formed by a plurality of memory cells arranged in a direction perpendicular to a principal surface of a semiconductor substrate 10 (see FIG. 2). The stepped region 200b functions as a contact region for word lines.

Figure 2:
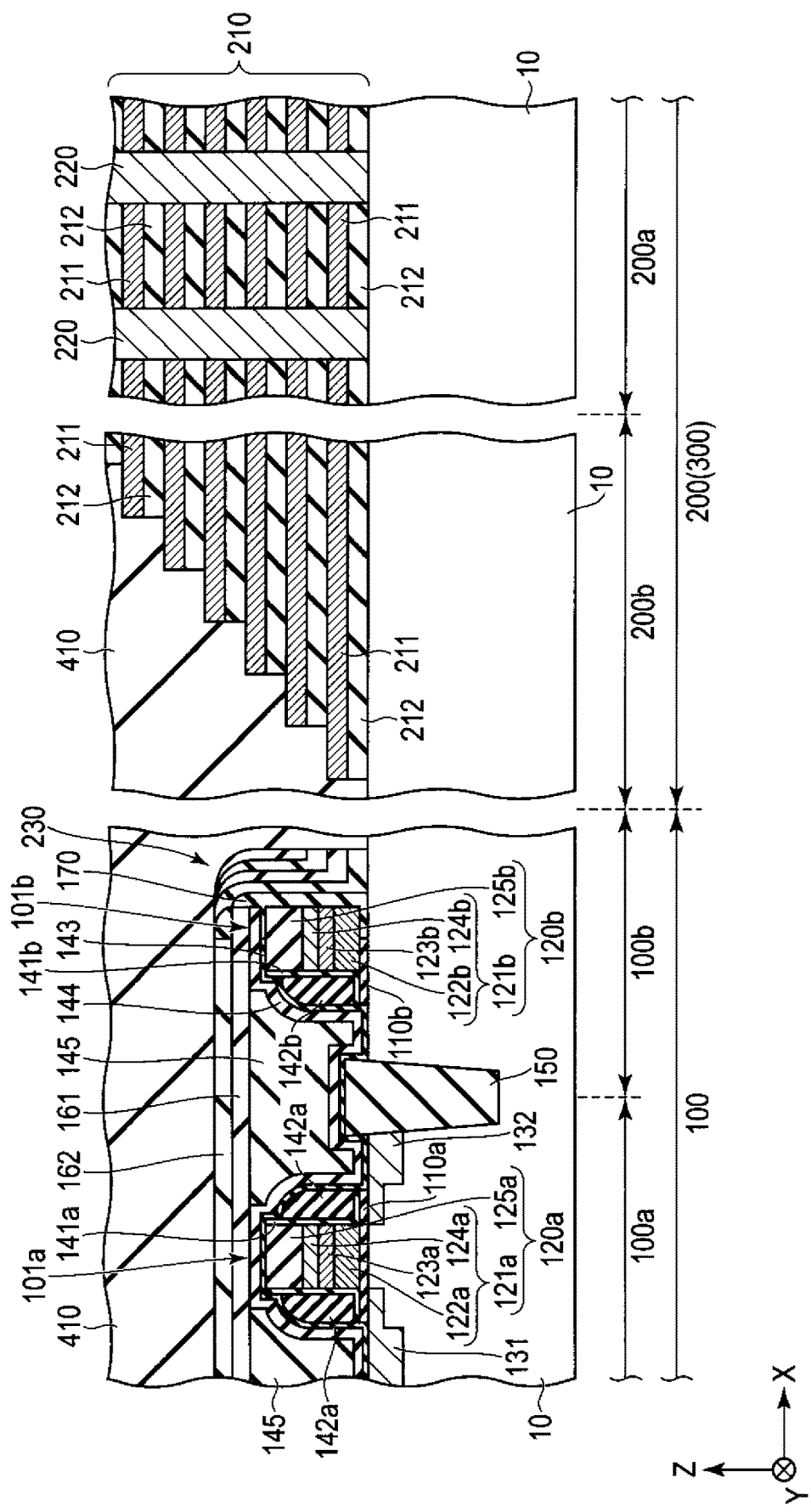
FIG. 2 is a cross-sectional view of a semiconductor device according to an embodiment.

FIG. 2 is a cross-sectional view schematically showing a configuration of a semiconductor device according to the present embodiment.

The peripheral circuit region 100 includes a MOS transistor section 101a in the circuit region 100a and a dummy structure section 101b in the dummy region 100b. The dummy region 100b may also be referred to as a non-circuit region. An element isolation insulating layer 150 is in a boundary region between the circuit region 100a and the dummy region 100b.

The MOS transistor section 101a is used in actual circuit operations. The MOS transistor section 101a includes a gate insulating layer 110a on the semiconductor substrate 10, a gate structure 120a on the gate insulating layer 110a, a source layer 131, and a drain layer 132.

The gate insulating layer 110a is between the semiconductor substrate 10 and the gate structure 120a and formed from a silicon oxide film.

The gate structure 120a includes a gate electrode 121a on the gate insulating layer 110a and a cap insulating layer 125a on the gate electrode 121a.

The gate electrode 121a is formed from a conductive film. This conductive film for the gate electrode 121a may be formed as a single conductive material film or formed by stacking a plurality of conductive material films. In the present embodiment, the conductive film for the gate electrode 121a includes a plurality of stacked conductive material films. Specifically, the conductive film for the gate electrode 121a is formed from polysilicon films 122a and 123a and a tungsten silicide film 124a.

The cap insulating layer 125a is formed from an insulating material different from silicon oxide. Specifically, the cap insulating layer 125a is formed from a silicon nitride film.

Furthermore, silicon oxide films 141a and 142a serving as spacer insulating layers are provided on an upper surface of the gate insulating layer 110a and a side surface of the gate structure 120a.

The dummy structure section 101b is not electrically connected to external interconnections and thus does not function as a MOS transistor although it has a MOS transistor-like structure. The dummy structure section 101b includes a dummy gate insulating layer 110b on the semiconductor substrate 10 and a dummy gate structure 120b having a portion on the dummy gate insulating layer 110b.

The dummy gate insulating layer 110b is provided on the semiconductor substrate 10 and formed from a silicon oxide film. The dummy gate insulating layer 110b has a first side surface (an outer edge) located, on the dummy insulating layer 110b, nearest outer region 300. This outer region 300 is a region located outside of the peripheral circuit region 100. The outer region 300 encompasses the memory region 200. The first side surface is recessed in a –X direction to be farther from the outer region 300 than an outermost edge of the dummy gate structure 120b. The first side surface of the dummy gate insulating layer 110b is in a region between the semiconductor substrate 10 and the dummy gate structure 120b in the Z direction. The dummy gate insulating layer 110b is, therefore, only interposed between the semiconductor substrate 10 and a portion of the dummy gate structure 120b rather than covering the entire lower surface of the dummy gate structure 120b.

The dummy gate insulating layer 110b is formed in the same process as the gate insulating layer 110a using the same insulating material (silicon oxide) as that for the gate insulating layer 110a. Owing to this, a thickness of the dummy gate insulating layer 110b matches a thickness of the gate insulating layer 110a. That is, the thickness of the dummy gate insulating layer 110b is substantially identical to that of the gate insulating layer 110a.

The dummy gate structure 120b includes a dummy gate electrode 121b and a cap insulating layer 125b. The dummy gate electrode 121b has a portion directly contacting the dummy gate insulating layer 110b. The cap insulating layer 125b is on the dummy gate electrode 121b. The dummy gate structure 120b has a second side surface located nearest the outer region 300. The first side surface of the dummy gate insulating layer 110b described above is recessed from the second side surface of the dummy gate structure 120b.

The dummy gate structure 120b is formed in the same process to the gate structure 120a using the same material as that for the gate structure 120a. Owing to this, a thickness of the dummy gate structure 120b corresponds to a thickness of the gate structure 120a. That is, the thickness of the dummy gate structure 120b is substantially identical to that of the gate structure 120a. More specifically, a thickness of the dummy gate electrode 121b is substantially identical to a thickness of the gate electrode 121a, and a thickness of the cap insulating layer 125b is substantially identical to a thickness of the cap insulating layer 125a.

The dummy gate electrode 121b is formed from a conductive film. This conductive film for the dummy gate electrode 121b may be formed by a single conductive material film or formed by stacking a plurality of conductive material films. The conductive film for the dummy gate electrode 121b is identical in composition to the conductive film for the gate electrode 121a. The conductive film for the dummy gate electrode 121b is, therefore, formed from the polysilicon films 122b and 123b and the tungsten silicide film 124b in this embodiment.

The cap insulating layer 125b is formed from an insulating film different from a silicon oxide film. This insulating material for the cap insulating layer 125b is identical to the insulating material for the cap insulating layer 125a. The cap insulating layer 125b is, therefore, formed from a silicon nitride film.

Furthermore, silicon oxide films 141b and 142b are provided as spacer insulating layers on an upper surface of the dummy gate insulating layer 110b and a side surface of the dummy gate structure 120b. These silicon oxide films 141b and 142b are also formed in the same process as the silicon oxide films 141a and 142a in the circuit region 100a.

An upper insulating layer 143 formed from a silicon oxide film is provided on the gate structure 120a, the dummy gate structure 120b, and the spacer insulating layers (that is, the silicon oxide films 141a, 142a, 141b, and 142b). The upper insulating layer 143 has a third side surface (outer edge) located nearest the outer region 300, and this third side surface is recessed in the direction (–X direction) away from the outer region 300. That is, the third side surface of the upper insulating layer 143 is recessed to be farther away from the outer region 300 than is the second side surface of the dummy gate structure 120b. The upper insulating layer 143 is, therefore, only partially provided on the dummy gate structure 120b. That is, the upper insulating layer 143, does not cover the entirety of the dummy gate structure 120b.

A liner insulating layer 144 formed from a silicon nitride film is provided on the upper insulating layer 143. The liner insulating layer 144 may be a conformal layer. An insulating layer 145 formed from a silicon oxide film is provided on the liner insulating layer 144.

An insulating layer 161 formed from a silicon nitride film is provided on the liner insulating layer 144 and the insulating layer 145, and an insulating layer 162 formed from a silicon oxide film is provided on the insulating layer 161. These insulating layers 161 and 162 are used as a stopper in an etching process and a CMP process.

A protective insulating layer 170 is provided on the dummy structure section 101b and side surfaces of the insulating layers 161 and 162. That is, the protective insulating layer 170 covers the first side surface of the dummy gate insulating layer 110b, the second side surface of the dummy gate structure 120b, the third side surface of the upper insulating layer 143, a side surface of the liner insulating layer 144, and the side surfaces of the insulating layers 161 and 162. The protective insulating layer 170 is formed from an insulating material different from the silicon oxide. Specifically, the protective insulating layer 170 is formed from an insulating film having higher hydrogen barrier properties (blocking properties) than the silicon oxide film. In the present embodiment, the protective insulating layer 170 is formed from a silicon nitride film.

As already described, the first side surface of the dummy gate insulating layer 110b is recessed in the direction (–X direction) to be farther away from the outer region 300. Therefore, there is a region where the dummy gate insulating layer 110b is not provided in between the semiconductor substrate 10 and the dummy gate structure 120b. The protective insulating layer 170 includes a first extension portion located in this region where the dummy gate insulating layer 110b is not provided. That is, the protective insulating layer 170 has the first extension portion that is located between the semiconductor substrate 10 and the dummy gate structure 120b. The first extension portion of the protective insulating layer 170 thus extends toward the recessed first side surface of the dummy gate insulating layer 110b.

Additionally, the third side surface of the upper insulating layer 143 is also recessed in the direction (–X direction) away from the outer region 300. Therefore, there is a region on the dummy gate structure 120b where the upper insulating layer 143 is not provided. The protective insulating layer 170 includes a second extension portion located in this region where the upper insulating layer 143 is not provided. That is, the second extension portion of the protective insulating layer 170 is located on the dummy gate structure 120b and extends toward the recessed third side surface of the upper insulating layer 143.

In this way, in the present embodiment, the first side surface of the dummy gate insulating layer 110b, the second side surface of the dummy gate structure 120b, and the third side surface of the upper insulating layer 143 are covered with the protective insulating layer 170. With such a configuration, the protective insulating layer 170 can prevent hydrogen penetration into the dummy gate insulating layer 110b and the upper insulating layer 143 as described later.

Moreover, a stacked portion 230 left unremoved at a time of forming a stacked structure 210 in the memory region 200 to be described later is formed on a side surface of the protective insulating layer 170.

While FIG. 2 shows a configuration of a region where the peripheral circuit region 100 is adjacent to the memory region 200, a basic configuration of the dummy region (non-circuit region) 100b is similar to the configuration shown in FIG. 2 even in a region where the peripheral circuit region 100 is not adjacent to the memory region 200.

The memory region 200 is provided adjacent to the peripheral circuit region 100, and includes the cell array region 200a and the stepped region 200b adjacent to the cell array region 200a. The stacked structure 210 and a plurality of pillar structures 220 are provided in the memory region 200.

The stacked structure 210 is provided on the semiconductor substrate 10 and continuously provided between the cell array region 200a and the stepped region 200b. The stacked structure 210 has a structure such that a plurality of conductive layer 211 and a plurality of insulating layers 212 are alternately stacked in the direction (Z direction) perpendicular to the principal surface of the semiconductor substrate 10. The conductive layers 211 function as word lines and are formed from a metallic material such as tungsten (W). The insulating layers 212 each insulate the conductive layers 211 from each other and are formed from an insulating material such as a silicon oxide.

The stacked structure 210 has a stepped end portion in the stepped region 200b, and a step is formed per pair of the conductive layer 211 and the insulating layer 212. As shown in FIG. 1, the stepped region 200b surrounds the cell array region 200a, and pillar shaped contact interconnections are connected to the word lines (conductive layers 211) in the stepped region 200b (not shown).

The pillar structures 220 are provided within the cell array region 200a. Each pillar structure 220 extends in the direction (Z direction) perpendicular to the principal surface of the semiconductor substrate 10 within the stacked structure 210, and includes a semiconductor layer and a charge storage layer that surrounds a side surface of the semiconductor layer as described later.

Figure 3:
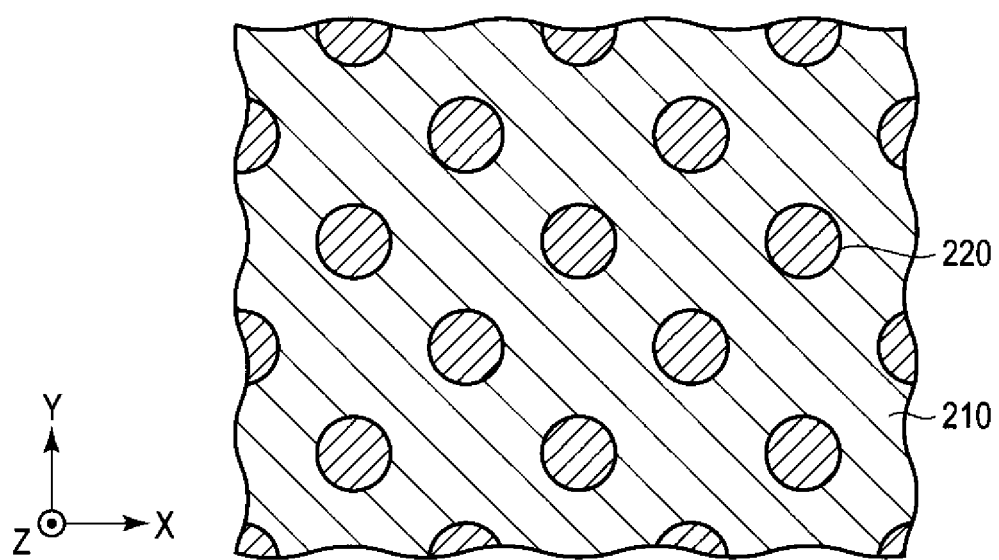
FIG. 3 is a plan view schematically showing an arrangement of pillar structures in a semiconductor device according to an embodiment.

FIG. 3 is a plan view schematically showing an example of the arrangement of the pillar structures 220. As shown in FIG. 3, the plurality of pillar structures 220 are arranged in parallel to an XY plane (plane perpendicular to the Z direction), and the pillar structures 220 are surrounded by the stacked structure 210.

Figure 4B:
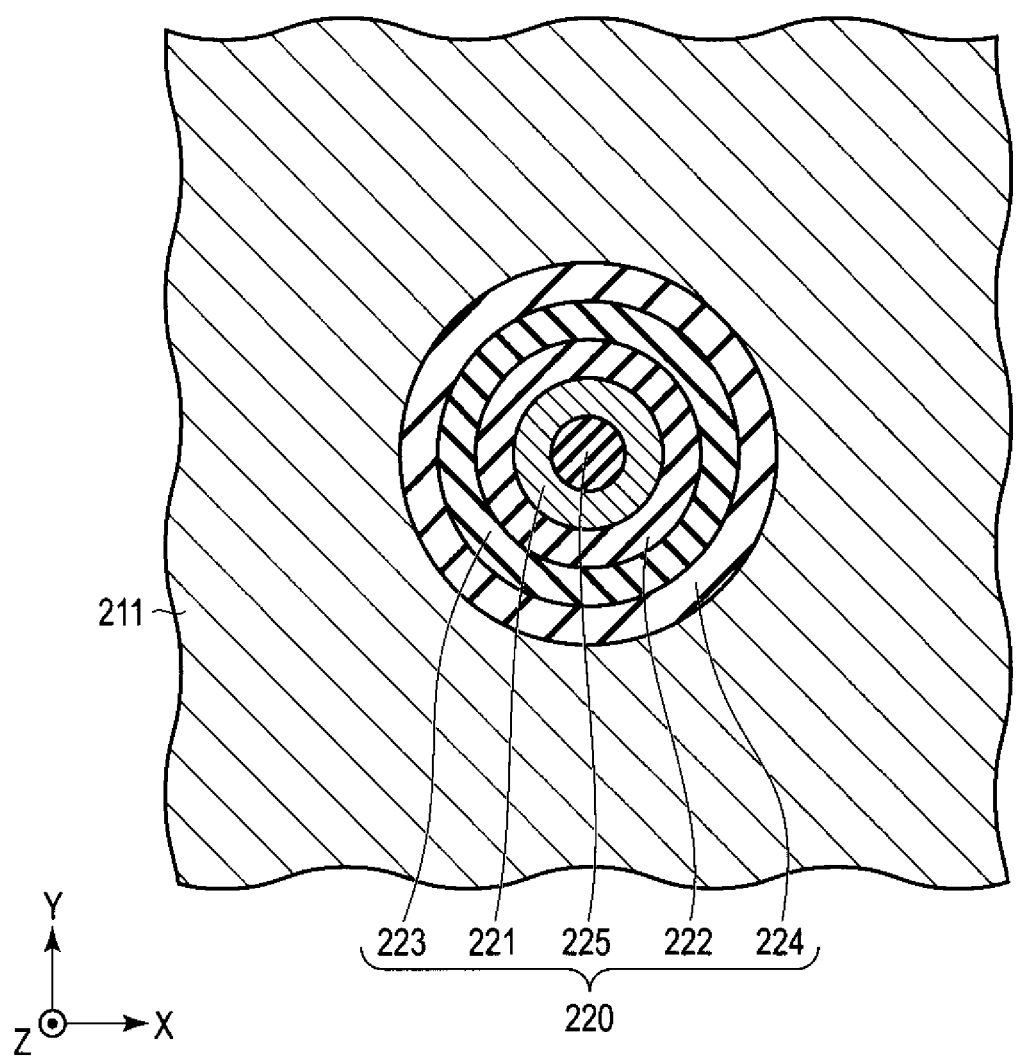
FIG. 4B is a cross-sectional view schematically showing details of a memory cell section in a semiconductor device according to an embodiment.

FIGS. 4A and 4B are cross-sectional views schematically showing a detailed configuration of a memory cell section configured with the conductive layers 211 of the stacked structure 210 and the pillar structures 220. FIG. 4A is a cross-sectional view in a direction parallel to the Z direction, and FIG. 4B is a cross-sectional view in the direction perpendicular to the Z direction.

Each pillar structure 220 includes a semiconductor layer 221, a tunnel insulating layer 222, a charge storage layer 223, a block insulating layer 224, and a core insulating layer 225. Each of the semiconductor layer 221, the tunnel insulating layer 222, the charge storage layer 223, and the block insulating layer 224 has a cylindrical shape, and the core insulating layer 225 has a columnar shape. Specifically, the semiconductor layer 221 surrounds a side surface of the core insulating layer 225, the tunnel insulating layer 222 surrounds a side surface of the semiconductor layer 221, the charge storage layer 223 surrounds a side surface of the tunnel insulating layer 222, and the block insulating layer 224 surrounds a side surface of the charge storage layer 223. The semiconductor layer 221 is formed from silicon, the tunnel insulating layer 222 is formed from a silicon oxide film, the charge storage layer 223 is formed from a silicon nitride film, the block insulating layer 224 is formed from a silicon oxide film, and the core insulating layer 225 is formed from a silicon oxide film.

The conductive layers 211 surrounding the pillar structures 220 function as gate electrodes, and memory cells are constituted by portions, which function as the gate electrodes, of the conductive layers 211 and portions, which are surrounded by the conductive layers 211, of the pillar structures 220. Furthermore, the conductive layers 211 extend to the stepped region 200b as the word lines.

As shown in FIG. 2, structures of the peripheral circuit region 100 and the memory region 200 described above are covered with an interlayer insulating film 410 formed from a silicon oxide film.

As described above, in the present embodiment, the first side surface of the dummy gate insulating layer 110b, the second side surface of the dummy gate structure 120b, and the third side surface of the upper insulating layer 143 are covered with the protective insulating layer 170. Owing to this, the protective insulating layer 170 can prevent hydrogen penetration to be described hereinafter.

In general, hydrogen tends to diffuse in the silicon oxide film. Owing to this, if the protective insulating layer 170 is not provided, hydrogen possibly penetrates into the dummy gate insulating layer 110b formed from the silicon oxide film and the upper insulating layer 143 formed from the silicon oxide film through the first side surface of the dummy gate insulating layer 110b and the third side surface of the upper insulating layer 143. Furthermore, hydrogen diffuses in the dummy gate insulating layer 110b and the upper insulating layer 143 and possibly arrives in the circuit region 100a. As a result, characteristics and reliability of the MOS transistor section 101a provided within the circuit region 100a are possibly adversely influenced.

In the present embodiment, the first side surface of the dummy gate insulating layer 110b and the third side surface of the upper insulating layer 143 are covered with the protective insulating layer 170; thus, hydrogen barrier properties (hydrogen blocking properties) of the protective insulating layer 170 can prevent hydrogen penetration.

In the present embodiment, the first side surface of the dummy gate insulating layer 110b and the third side surface of the upper insulating layer 143 are recessed in the direction away from the outer region 300. That is, the first side surface of the dummy gate insulating layer 110b and the third side surface of the upper insulating layer 143 are recessed from the second side surface of the dummy gate structure 120b. Owing to this, the distance from the side surface (more particularly, the side surface facing the outer region 300) of the protective insulating layer 170 to the first and third side surfaces can be increased. It is, therefore, possible to further improve the hydrogen barrier properties (hydrogen blocking properties) of the protective insulating layer 170 and prevent hydrogen penetration more effectively.

While the interlayer insulating film 410 formed from the silicon oxide film is provided above the MOS transistor section 101a and the dummy structure section 101b, hydrogen diffusing in the interlayer insulating film 410 can be blocked by the insulating layer 161 formed from the silicon nitride film.

A semiconductor device manufacturing method according to the present embodiment will next be described with reference to FIGS. 5 to 12.

First, as shown in FIG. 5, the MOS transistor section 101a is formed in the circuit region 100a. At this time, similar MOS structures to the MOS transistor section 101a are also formed in the dummy region 100b and the memory region 200 in the same process as the MOS transistor section 101a. That is, the dummy gate insulating layer 110b, the dummy gate electrode 121b, and the cap insulating layer 125b are formed in the dummy region 100b and the memory region 200 to correspond to the gate insulating layer 110a, the gate electrode 121a, and the cap insulating layer 125a of the MOS transistor section 101a. Furthermore, the spacer insulating layers (silicon oxide films 141b and 142b) are formed in the dummy region 100b to correspond to the spacer insulating layers (silicon oxide films 141a and 142a) in the circuit region 100a. The upper insulating layer 143 and the liner insulating layer 144 are formed through the peripheral circuit region 100 and the memory region 200.

Figure 6:
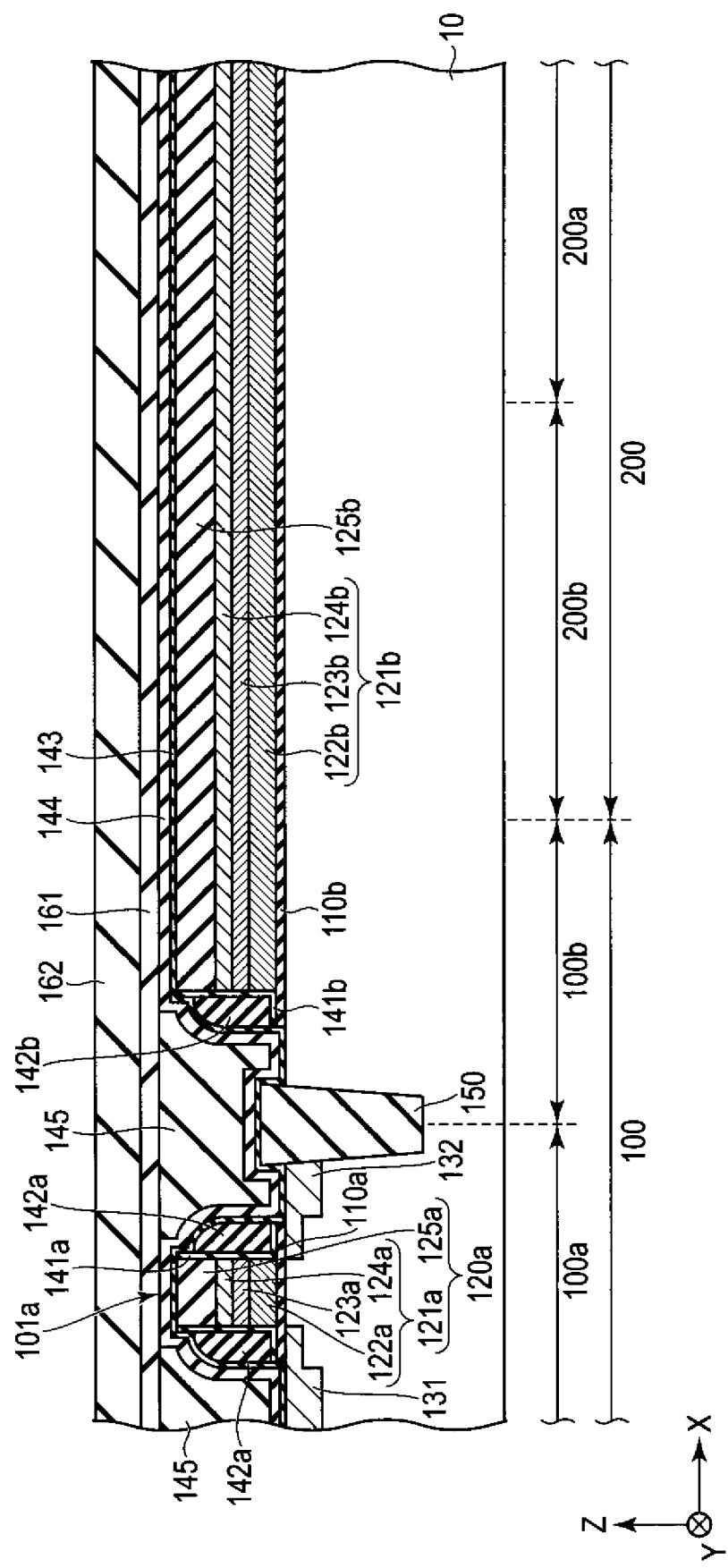

Next, as shown in FIG. 6, the silicon nitride film is formed as the insulating layer 161 and the silicon oxide film is formed as the insulating layer 162 in the peripheral circuit region 100 and the memory region 200.

Figure 7:
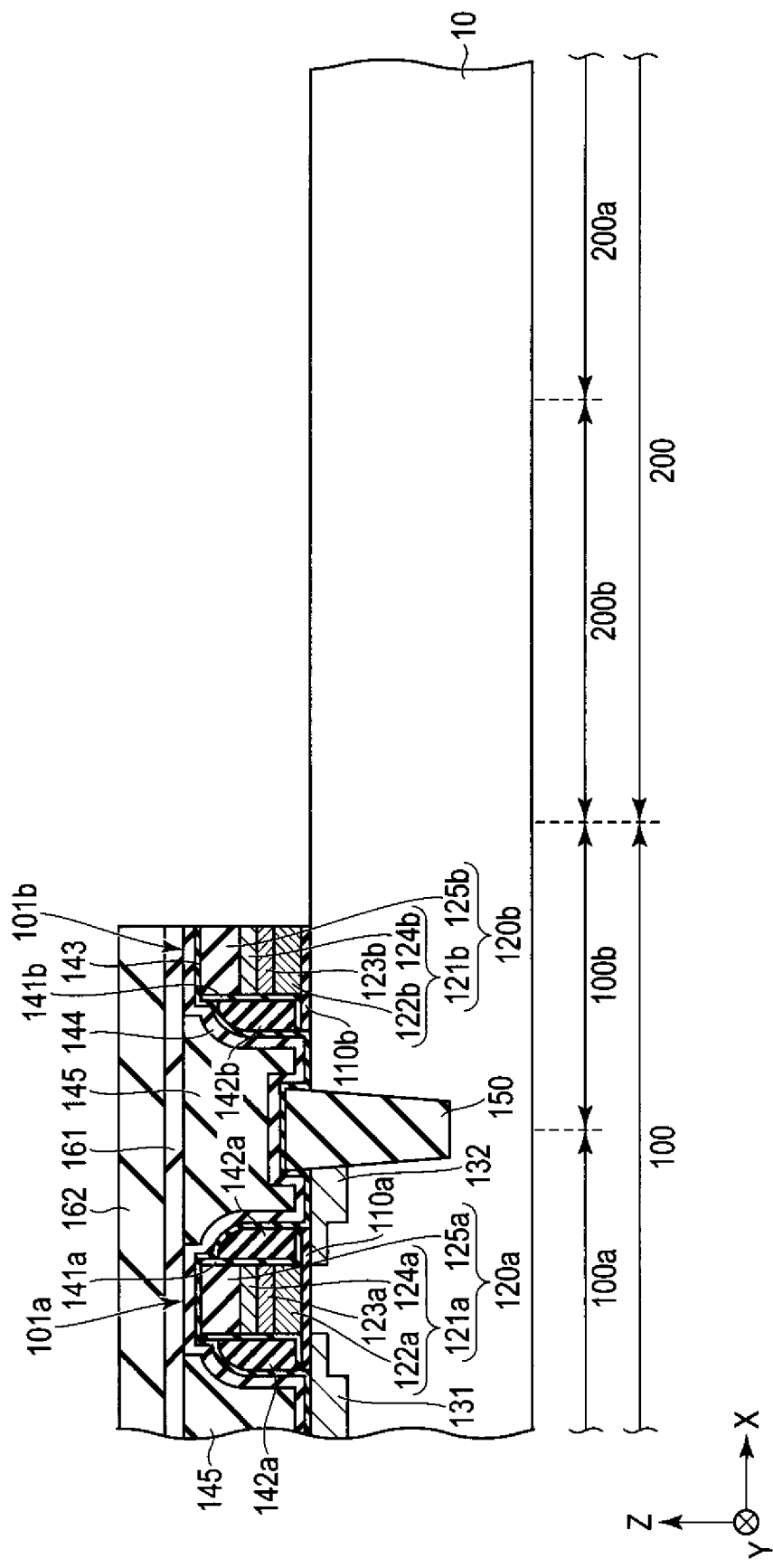

Next, as shown in FIG. 7, the dummy gate insulating layer 110b, the dummy gate electrode 121b, the cap insulating layer 125b, the upper insulating layer 143, the liner insulating layer 144, and the insulating layers 161 and 162 mainly formed in the memory region 200 are removed.

Figure 8:
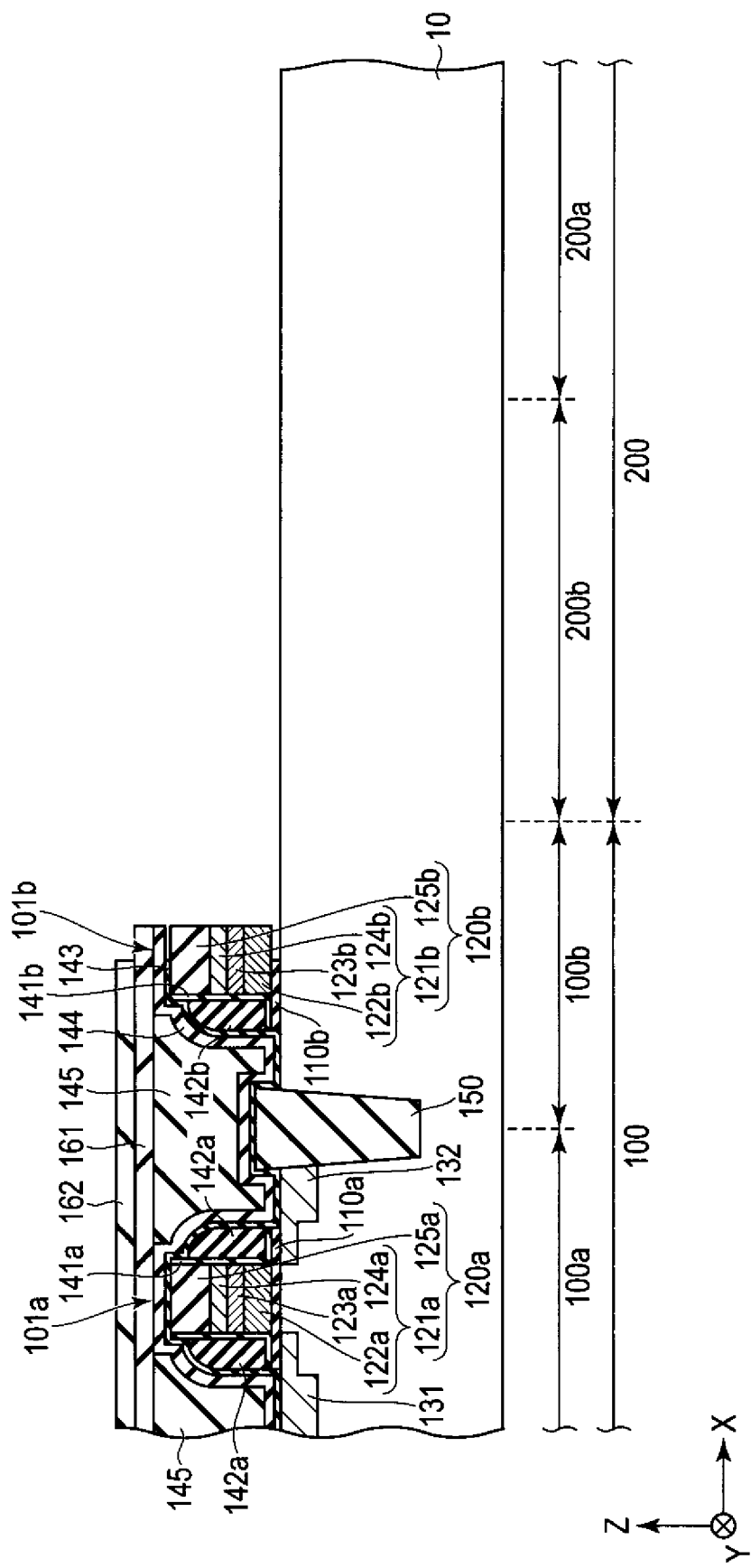

Next, as shown in FIG. 8, the dummy gate insulating layer 110b and the upper insulating layer 143 formed from the silicon oxide film are recessed by selective etching. At this time, the insulating layer 162 formed from the silicon oxide film is also etched, the edge of the insulating layer 162 is also retreated, and the insulating layer 162 becomes thinner.

Figure 9:
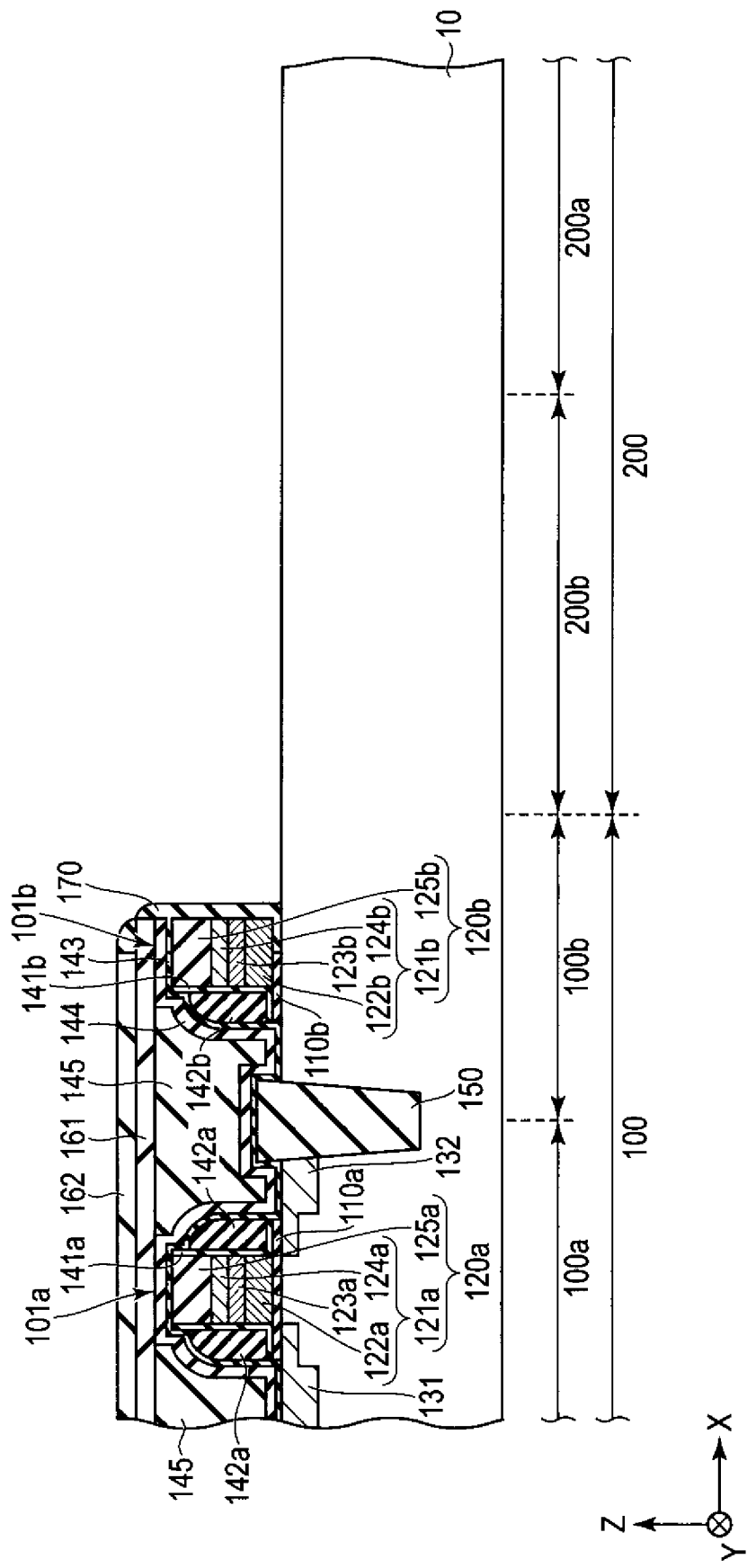

Next, as shown in FIG. 9, the silicon nitride film is formed as the protective insulating layer 170. Specifically, the silicon nitride film is formed on the entire surface including a cavity between the dummy gate structure 120b and the semiconductor substrate 10 and a cavity between the dummy gate structure 120b and the liner insulating layer 144. Subsequently, anisotropic etching such as RIE is conducted to remove the silicon nitride film from the semiconductor substrate 10 and the insulating layer 162. As a result, the shape of the protective insulating layer 170 shown in FIG. 9 is obtained.

Figure 10:
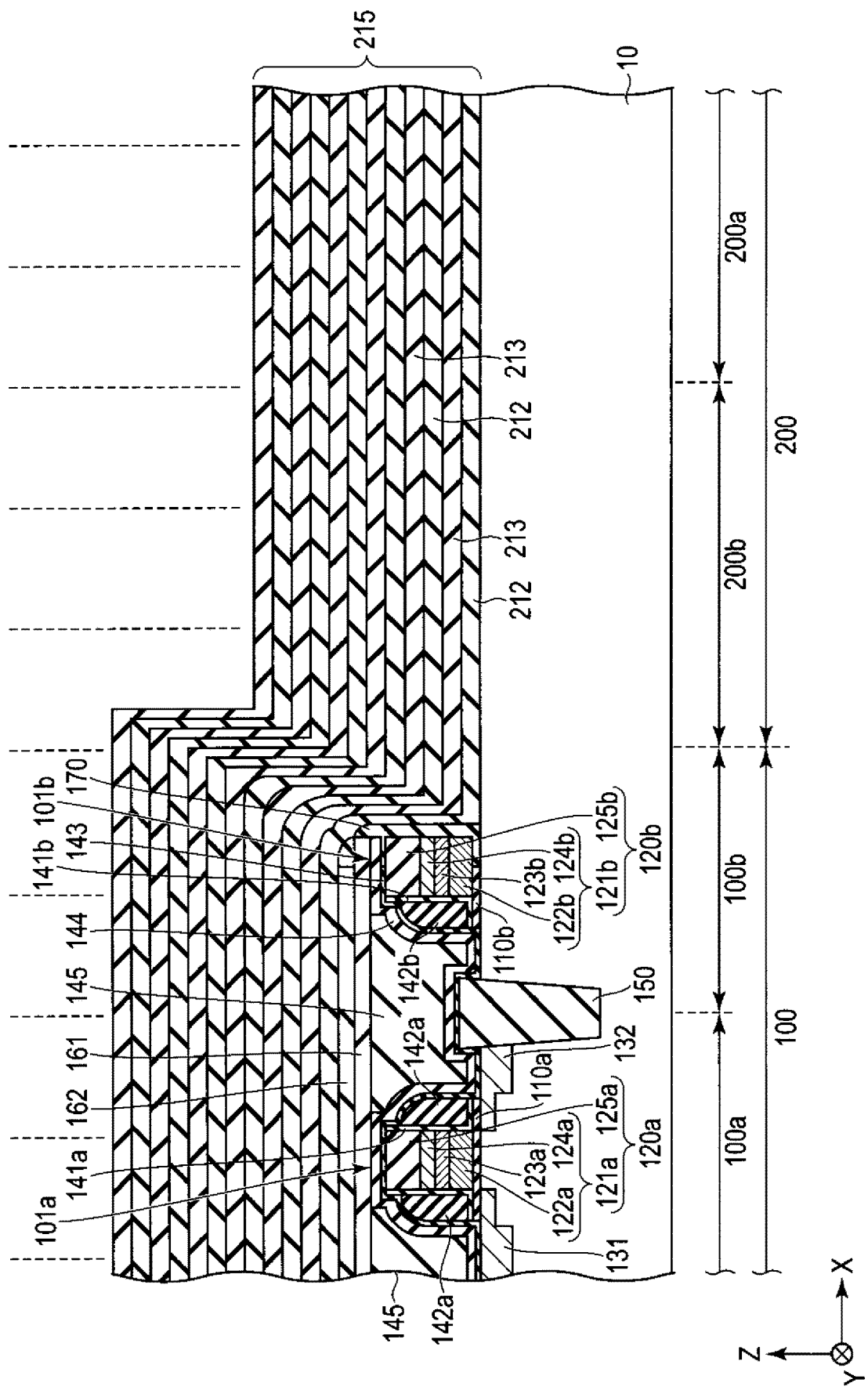

Next, as shown in FIG. 10, a stacked film 215 is formed on the entire surface. Specifically, the stacked film 215 is formed by alternately stacking a plurality of silicon oxide films 212 and a plurality of silicon nitride films 213. While FIG. 10 illustrates six pairs of silicon oxide films 212 and silicon nitride films 213, more silicon oxide films 212 and more silicon nitride films 213 are typically deposited in an actual device.

After depositing the stacked film 215 of the silicon oxide films 212 and the silicon nitride films 213 as described above, a high temperature treatment process is further performed. In this high temperature treatment process, hydrogen is released from the stacked film 215. As already described, hydrogen tends to diffuse in a silicon oxide film. Owing to this, if the protective insulating layer 170 were not provided, hydrogen released from the stacked film 215 might possibly penetrate into the circuit region 100a through the dummy gate insulating layer 110b and the upper insulating layer 143 (which are each formed from a silicon oxide film) and this might possibly adversely influence the characteristics and the reliability of the MOS transistor section 101a.

In the present embodiment, the first side surface of the dummy gate insulating layer 110b and the third side surface of the upper insulating layer 143 are covered with the protective insulating layer 170; thus, the hydrogen barrier properties (hydrogen blocking properties) of the protective insulating layer 170 can prevent hydrogen penetration.

Figure 11:
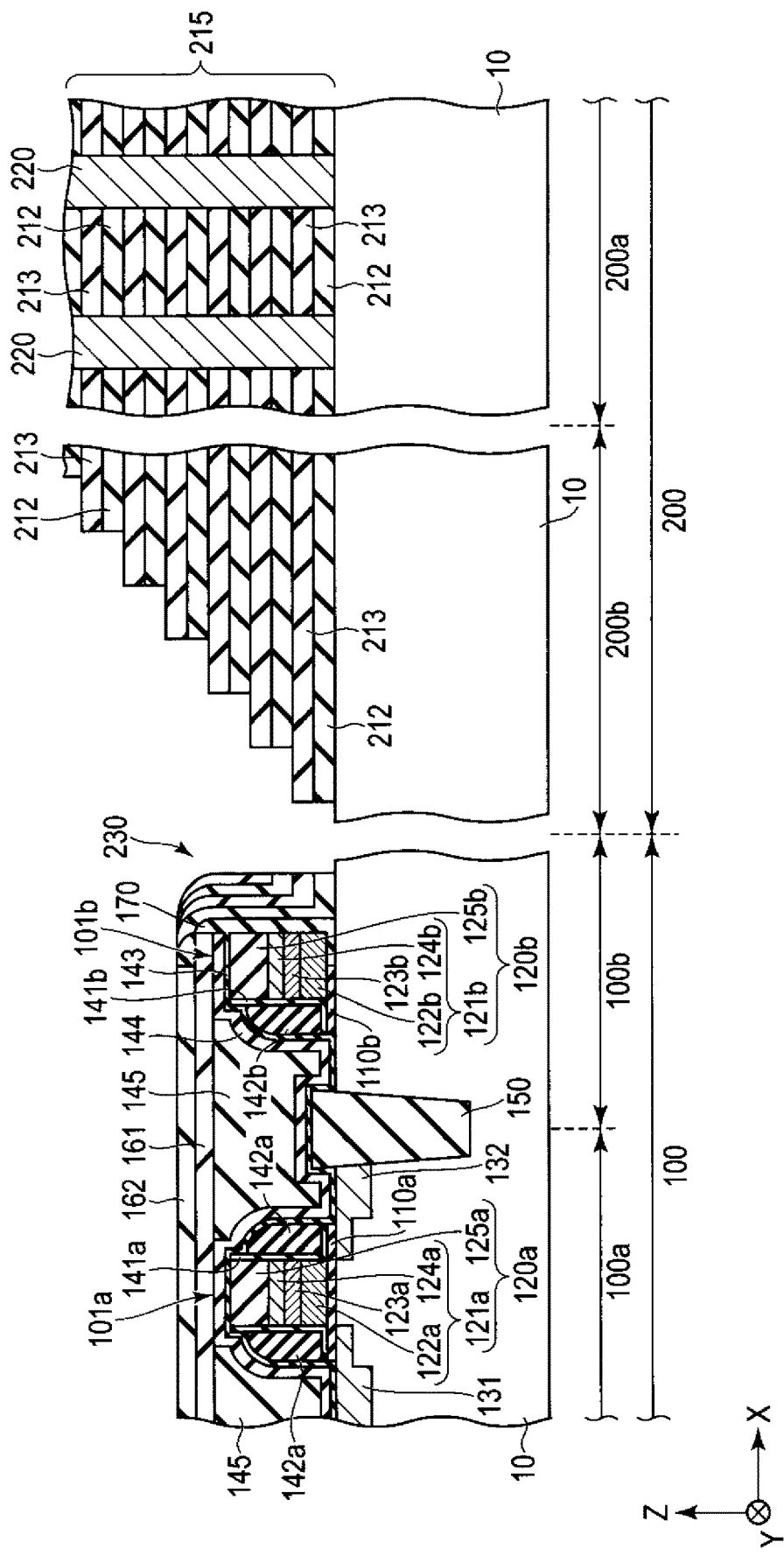

Next, as shown in FIG. 11, the stacked film 215 is patterned by a plurality of times by anisotropic etching using RIE or the like, thereby forming a stepped shape at an end portion of the stacked film 215. At this time, a portion 230 of the stacked film 215 still remains on the side surface of the protective insulating layer 170.

Figure 12:
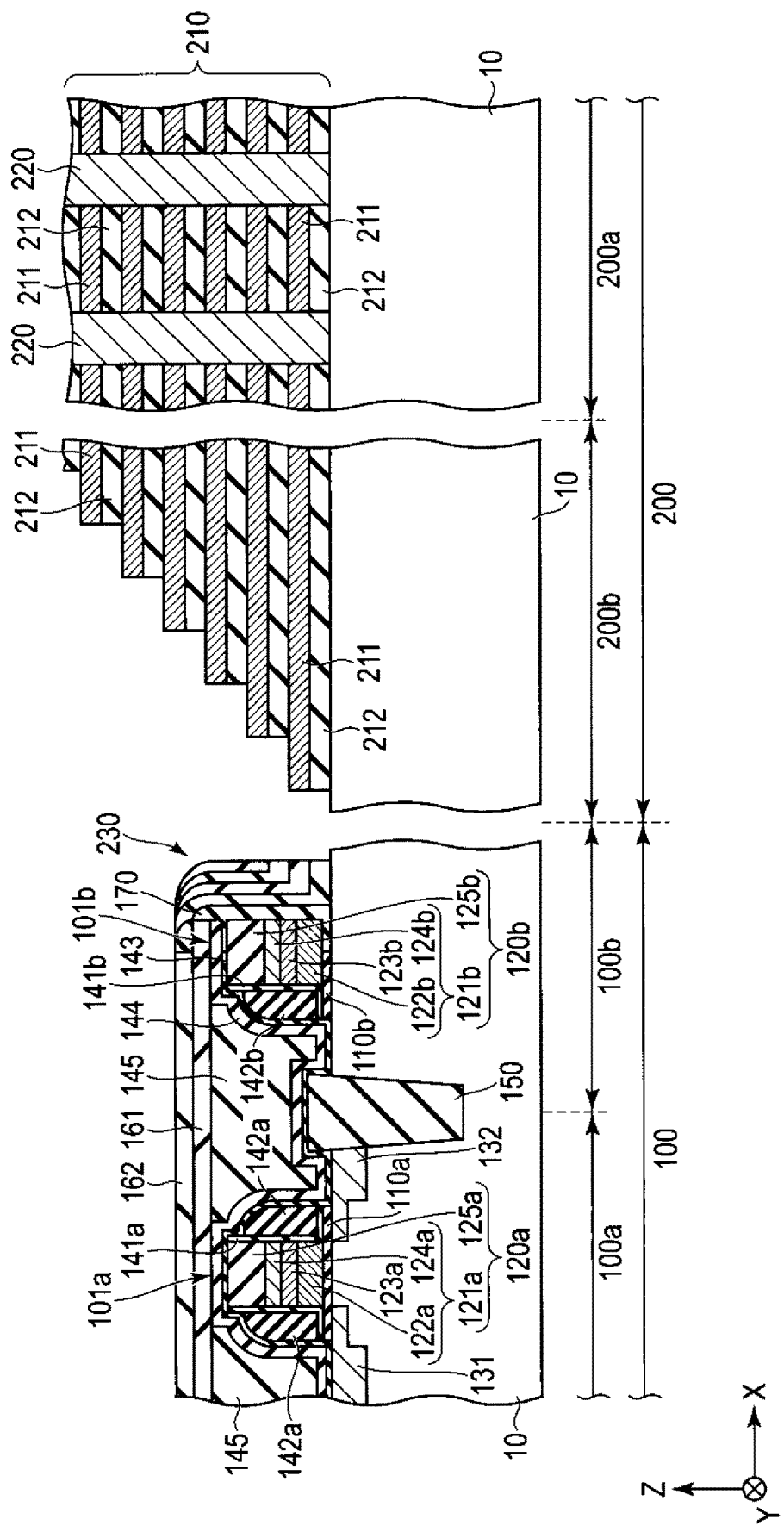

Next, as shown in FIG. 12, a replacement process is performed to replace the silicon nitride films 213 with the conductive layers 211, which are formed from a metallic material such as tungsten (W). Specifically, the silicon nitride films 213 are removed by wet etching while the overall peripheral circuit region 100 has been covered with a resist pattern or the like. This wet etching forms a plurality of cavities between the insulating layers 212, which are silicon oxide films in this example. These cavities are then filled with conductive material (for example, tungsten) for conductive layers 211, thereby completing the replacement process.

The interlayer insulating film 410 is then formed on the entire surface, and the various contact interconnections (not separately shown) and the like are subsequently formed, thereby obtaining the configuration shown in FIG. 2.

As described above, in the present embodiment, the first side surface of the dummy gate insulating layer 110b and the third side surface of the upper insulating layer 143 are covered with the protective insulating layer 170. Therefore, the protective insulating layer 170 can prevent the hydrogen penetration and the adverse influences therefrom on the MOS transistor section 101a.

Furthermore, in the present embodiment, the first side surface of the dummy gate insulating layer 110b and the third side surface of the upper insulating layer 143 are recessed away from the outer region 300. It is, therefore, possible to increase the distance from the side surface of the protective insulating layer 170 to the first and third side surfaces, and prevent the hydrogen penetration more effectively. That is, the thickness of the protective insulating layer 170 formed on the first and third side surface can be increased to limit hydrogen penetration/diffusion.

Figure 13:
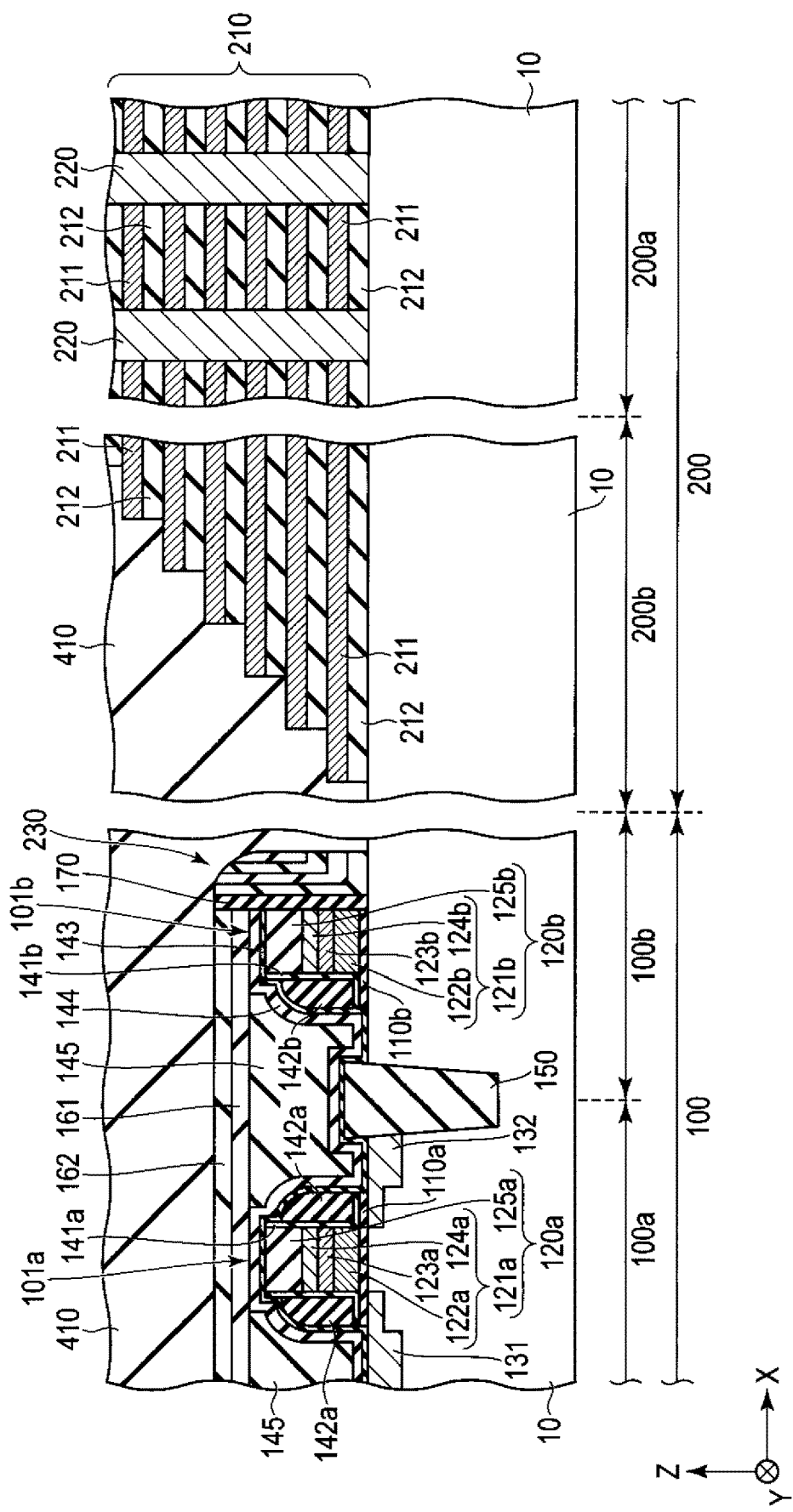
FIG. 13 is a cross-sectional view schematically showing a modification of a semiconductor device according to an embodiment.

FIG. 13 is a cross-sectional view schematically showing a configuration of a modification of a semiconductor device according to the present embodiment.

The basic configuration of this modified semiconductor device is similar to the configuration of the embodiment described above. The protective insulating layer 170 covers the first side surface of the dummy gate insulating layer 110b, the second side surface of the dummy gate structure 120b, and the third side surface of the upper insulating layer 143. However, in this modification the first side surface of the dummy gate insulating layer 110b and the third side surface of the upper insulating layer 143 are not recessed.

Owing to this, the protective insulating layer 170 does not have extension portions in the region between the semiconductor substrate 10 and the dummy gate structure 120b and in the region on upper surface of the dummy gate structure 120b.

However, even with such a configuration, the first side surface of the dummy gate insulating layer 110b and the third side surface of the upper insulating layer 143 are still covered with the protective insulating layer 170; thus, the protective insulating layer 170 can still limit hydrogen penetration similarly to the embodiment described above.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
a memory region and a peripheral circuit region adjacent to each other on a semiconductor substrate, the peripheral circuit region including a first region and a second region on an outer perimeter of the first region;
a transistor in the first region, the transistor including a gate insulating layer on the semiconductor substrate and a gate structure on the gate insulating layer, the gate structure including a gate electrode;
a dummy structure in the second region, the dummy structure having a first insulating layer on the semiconductor substrate and a dummy gate electrode on the first insulating layer, the first insulating layer having a recessed end surface that is between the semiconductor substrate and an interior portion of the dummy gate electrode; and
a second insulating layer that covers the recessed end surface of the first insulating layer and a side surface of the dummy structure facing outward from the second region, wherein
the gate insulating layer and the first insulating layer are both silicon oxide and have the same thickness on the semiconductor substrate,
the second insulating layer is an insulating material other than silicon oxide, and
the second insulating layer further covers a portion but not all of an upper surface of the dummy structure.

2. The semiconductor device according to claim 1, further comprising:
a third insulating layer on an upper surface of the dummy structure, the third insulating layer having a side surface facing outward from the peripheral circuit region, wherein
the second insulating layer further covers the side surface of the third insulating layer, and
the third insulating layer is silicon oxide.

3. The semiconductor device according to claim 2, wherein
the third insulating layer does not extend to the side surface of the dummy structure,
the side surface of the third insulating layer is above an interior portion of the dummy structure, and
the second insulating layer extends on the upper surface of the dummy structure toward the side surface of the third insulating layer.

4. The semiconductor device according to claim 1, wherein the dummy gate electrode is not electrically connected to an external interconnect.

5. The semiconductor device according to claim 1, wherein the recessed end surface faces toward the memory region.

6. The semiconductor device according to claim 1, wherein the dummy gate electrode has a thickness equal to a thickness of the gate electrode.

7. The semiconductor device according to claim 1, wherein the gate electrode and the dummy electrode each comprise a plurality of stacked conductive films.

8. The semiconductor device according to claim 1, wherein the second insulating layer is silicon nitride.

9. The semiconductor device according to claim 1, further comprising:
a stacked structure on the semiconductor substrate in the memory region, the stacked structure comprising an alternating stack of conductive layers and insulating layers; and
a pillar structure in the memory region, the pillar structure extending orthogonal to the semiconductor substrate within the stacked structure, and the pillar structure including a semiconductor layer and a charge storage layer surrounding the semiconductor layer, wherein
the side surface of the dummy structure and the recessed end surface of the first insulating layer face an end region of the stacked structure.

10. A semiconductor device, comprising:
a memory region and a peripheral circuit region adjacent to each other on a semiconductor substrate, the peripheral circuit region including a first region and a second region on an outer perimeter of the first region;
a transistor in the first region, the transistor including a gate insulating layer on the semiconductor substrate and a gate structure on the gate insulating layer, the gate structure including a gate electrode;
a dummy structure in the second region, the dummy structure having a first insulating layer on the semiconductor substrate and a dummy gate electrode on the first insulating layer, the first insulating layer having a recessed end surface that is between the semiconductor substrate and an interior portion of the dummy gate electrode; and
a second insulating layer that covers the recessed end surface of the first insulating layer and a side surface of the dummy structure facing outward from the second region, wherein
the gate insulating layer and the first insulating layer are both silicon oxide and have the same thickness on the semiconductor substrate,
the second insulating layer is an insulating material other than silicon oxide, and
the second insulating layer is between the semiconductor substrate and the dummy gate electrode and contacts the recessed end surface of the first insulating layer.

11. The semiconductor device according to claim 10, wherein the second insulating layer is silicon nitride.

12. The semiconductor device according to claim 10, further comprising:
a stacked structure on the semiconductor substrate in the memory region, the stacked structure comprising an alternating stack of conductive layers and insulating layers; and a pillar structure in the memory region, the pillar structure extending orthogonal to the semiconductor substrate within the stacked structure, and the pillar structure including a semiconductor layer and a charge storage layer surrounding the semiconductor layer, wherein the side surface of the dummy structure and the recessed end surface of the first insulating layer face an end region of the stacked structure.

13. The semiconductor device according to claim 10, further comprising:

a third insulating layer on an upper surface of the dummy structure, the third insulating layer having a side surface facing outward from the peripheral circuit region, wherein the second insulating layer further covers the side surface of the third insulating layer, and the third insulating layer is silicon oxide.

14. The semiconductor device according to claim 13, wherein the third insulating layer does not extend to the side surface of the dummy structure, the side surface of the third insulating layer is above an interior portion of the dummy structure, and the second insulating layer extends on the upper surface of the dummy structure toward the side surface of the third insulating layer.

15. The semiconductor device according to claim 10, wherein the dummy gate electrode is not electrically connected to an external interconnect.

16. The semiconductor device according to claim 10, wherein the recessed end surface faces toward the memory region.

17. The semiconductor device according to claim 10, wherein the dummy gate electrode has a thickness equal to a thickness of the gate electrode.

18. The semiconductor device according to claim 10, wherein the gate electrode and the dummy electrode each comprise a plurality of stacked conductive films.

19. A nonvolatile semiconductor memory storage device, comprising:

a memory region including an alternating stack of conductive layers and insulating layers and a plurality of pillar structures extending through the alternating stack;

a peripheral circuit region adjacent to the memory region on a semiconductor substrate, the peripheral circuit region including a first region and a second region on an outer perimeter of the first region;

a transistor in the first region, the transistor having a gate insulating layer on the semiconductor substrate and a gate structure on the gate insulating layer, the gate structure including a gate electrode;

a dummy structure in the second region, the dummy structure having a first insulating layer on the semiconductor substrate and a dummy gate electrode on the first insulating layer, the first insulating layer having an end surface facing outward from the peripheral circuit region; and a second insulating layer that covers the end surface of the first insulating layer and a side surface of the dummy structure facing outward from the peripheral circuit region, wherein the gate insulating layer and the first insulating layer are both silicon oxide and have the same thickness on the semiconductor substrate, the second insulating layer is an insulating material other than silicon oxide, the end surface of the first insulating layer is recessed to a position that is between the semiconductor substrate and an interior portion of the dummy structure, and the second insulating layer extends between the semiconductor substrate and the dummy structure and contacts the end surface of the first insulating layer.

* * * * *